United States Patent
Satoh et al.

[11] Patent Number: 6,144,273
[45] Date of Patent: Nov. 7, 2000

[54] INHIBITOR SWITCH HAVING MAGNETIC CONTACT PORTION

[75] Inventors: Shunichi Satoh; Shinya Nakamura; Tetsuya Tomotoshi, all of Tokyo, Japan

[73] Assignee: Niles Parts Co., Ltd., Tokyo, Japan

[21] Appl. No.: 09/386,194

[22] Filed: Aug. 30, 1999

[30] Foreign Application Priority Data

Aug. 31, 1998 [JP] Japan .................................. 10-260912
Aug. 31, 1998 [JP] Japan .................................. 10-260914

[51] Int. Cl.$^7$ ........................................................ H01H 9/00
[52] U.S. Cl. .......................................... 335/207; 200/11 R
[58] Field of Search .................................. 335/205–207; 200/11 A, 11 D, 11 R, 61.88, 61.91, 61.96

[56] References Cited

U.S. PATENT DOCUMENTS

| | | | |
|---|---|---|---|
| 5,440,087 | 8/1995 | Cobb, III | 200/61.88 |
| 5,525,768 | 6/1996 | Cobb, III et al. | 200/61.88 |
| 5,811,747 | 9/1998 | Taniquchi et al. | 200/61.88 |
| 5,867,092 | 2/1999 | Vogt | 240/456 |
| 5,969,313 | 10/1999 | Ikeshima et al. | 200/61.88 |

FOREIGN PATENT DOCUMENTS 59-146222  9/1984  Japan .

*Primary Examiner*—Lincoln Donovan
*Attorney, Agent, or Firm*—Ronald P. Kananen; Rader, Fishman & Grauer

[57] ABSTRACT

An inhibitor switch is provided with a movable base 1 having permanent magnets 4, which is adapted to be rotatable in accordance with the transmission operating position of an automatic transmission device. The inhibitor switch also has magnetic sensors 9 for detecting the magnetic flux from the permanent magnets 4, a pole base 3, and a cover body 2 for rotatably supporting the movable base 1 in cooperation with the pole base 3. The pole base 3 has an approximate arc shape with a radius of curvature centered about the center of a shaft hole 3a. A base surface 3d is provided for forming a space for receiving a substrate 6 connected to the connecting sections 7a, on which the magnetic sensors 9 and electronic elements 10 are installed. The connecting sections 7a are used to electrically connect a conductive body 7 to the substrate 6. The shaft hole 3a is coupled with a cylindrical shaft section 1a of the movable base 1 at an end of the base surface 3d. This construction provides an inhibitor switch having permanent magnets with high operating precision and low manufacturing cost.

11 Claims, 9 Drawing Sheets

INHIBITOR SWITCH HAVING MAGNETIC CONTACT PORTION

RELATED APPLICATIONS

The subject matter of this application is related to the subject matter of the Applicants' copending application Ser. Nos. 09/386,193 filed Aug. 30, 1999, and Ser. No. 09/386,002 filed Aug. 30, 1999.

BACKGROUND OF THE INVENTION

1. Field of the Invention

The present invention relates generally to an inhibitor switch for switching contacts in accordance with the operating positions of an automatic transmission device used for automobiles. In particular, the present invention relates to an improvement of an inhibitor switch in which the contact portion is composed of a magnetic sensor and a permanent magnet.

2. Description of the Related Art

A conventional inhibitor switch is described, for example, in Japanese Utility Model Publication Laid-Open No. 59-146222. This conventional inhibitor switch has a permanent magnet fitted in a lever by using adhesive. A printed substrate provided with a magnetic flux detecting element is molded in a main body through an injection molding method. It has been required for an inhibitor switch to provide sufficient precision for the contact sections thereof. In conventional inhibitor switches, cutting works have been provided to obtain a precise dimension of the permanent magnet.

The conventional inhibitor switch described above has a substrate on which reed switches, connecting terminals and the like are installed by using solder. The substrate is molded into the main body by using an injection molding method. Therefore, it is necessary to provide a means such that the solder does not melt due to the injection of a melted resin. Further, it is impossible to change the initial tuning for resisters and electric elements, for example, which have been installed on the substrate after the injection molding. Therefore, it is often necessary to dump such substrates if a desired precision after the injection molding cannot be secured, thereby extremely increasing the manufacturing cost of the inhibitor switch.

The conventional inhibitor switches described above also have a problem that the precision as an inhibitor switch is insufficient due to the deviation of the setting position of the magnetic flux detecting elements. The deviation is caused by the printed substrate with low precision in dimension being fixed on a pole base.

SUMMARY OF THE INVENTION

It is an object of the present invention to provide an inhibitor switch that solves the problems found in the conventional inhibitor switch described above.

More specifically, it is an object of the present invention to provide an inhibitor switch with a low manufacturing cost, high handling property and efficiency in manufacturing.

Additional objects, advantages and novel features of the invention will be set forth in part in the description that follows, and in part will become apparent to those skilled in the art upon examination of the following or may be learned by practice of the invention. The objects and advantages of the invention may be realized and attained by means of the instrumentalities and combinations particularly pointed out in the appended claims.

In accordance with the present invention, in order to achieve the objects set forth above, an inhibitor switch is provided comprising a pole base provided with a movable base having permanent magnets and adapted to be rotated in accordance with the transmission operating position of an automatic transmission device, magnetic sensors for detecting the magnetic flux from the permanent magnets, and a cover body for rotatably supporting the movable base. The inhibitor switch is characterized in that the pole base has an approximate arc shape centered about a shaft hole and provided with a base surface for receiving a substrate on which the magnetic sensors and electric elements are installed. The base surface also forms projected connecting sections of a conductive body used for electric connection on the substrate. The pole base also has the shaft hole which is coupled with a cylindrical shaft section of the movable base at the end of the base surface.

The pole base is formed with a sliding surface formed at the periphery of the shaft hole for slidably contacting with a projected section formed at the lower surface of the movable base, and a sliding surface formed at the outer periphery of the base surface of the pole base for slidably contacting with a projected section formed at the lower surface of the movable base.

The pole base is formed with an inner peripheral edge of the sliding surface and an inner wall at the peripheral edge of the sliding surface.

The shaft hole of the pole base is positioned at the inner side of the sliding surface, and the pole base is formed with an outer peripheral edge of the sliding surface.

The pole base is provided with projections projected from the base surface. The projections are fitted with a positioning hole and a position adjusting hole mounted on the substrate, respectively.

The pole base is provided with a through hole formed with a projecting section projected from the aperture at the upper end side toward the inner side thereof on the base surface. The magnetic sensors are installed on the substrate inserted into the through hole as a receiving space therefor.

The substrate is sandwiched between the projecting section and a lower cover for closing the aperture at the lower end side of the through hole.

The electronic elements, such as the magnetic sensors installed on the substrate, are disposed within the projecting section.

According to another broad aspect of the present invention, an inhibitor switch is provided comprising a pole base provided with a movable base having permanent magnets and adapted to be rotated in accordance with the transmission operating position of an automatic transmission device, and magnetic sensors for detecting the magnetic flux from the permanent magnets, and a cover body for rotatably supporting the movable base. The inhibitor switch is characterized in that the pole base is formed with a receiving space comprising a blind hole for receiving a substrate installed with magnetic sensors at its lower surface.

The pole base is formed with a partition wall at the ceiling of the blind hole. The pole base is formed with a projecting section at the lower peripheral portion of the partition wall. The substrate is sandwiched between the projecting section and a lower cover for closing the aperture at the lower end side of the blind hole. The lower cover is formed with a pressing section for pressing the lower peripheral edge of the substrate, projected from the lower cover.

BRIEF DESCRIPTION OF THE DRAWINGS

The present invention will become more clearly appreciated as the disclosure of the invention is made with reference to the accompanying drawings. In the drawings.

DETAILED DESCRIPTION OF THE INVENTION

A first embodiment of the present invention will now be described in detail with reference to FIGS. 1 to 8 of the accompanying drawings.

Figure 2:
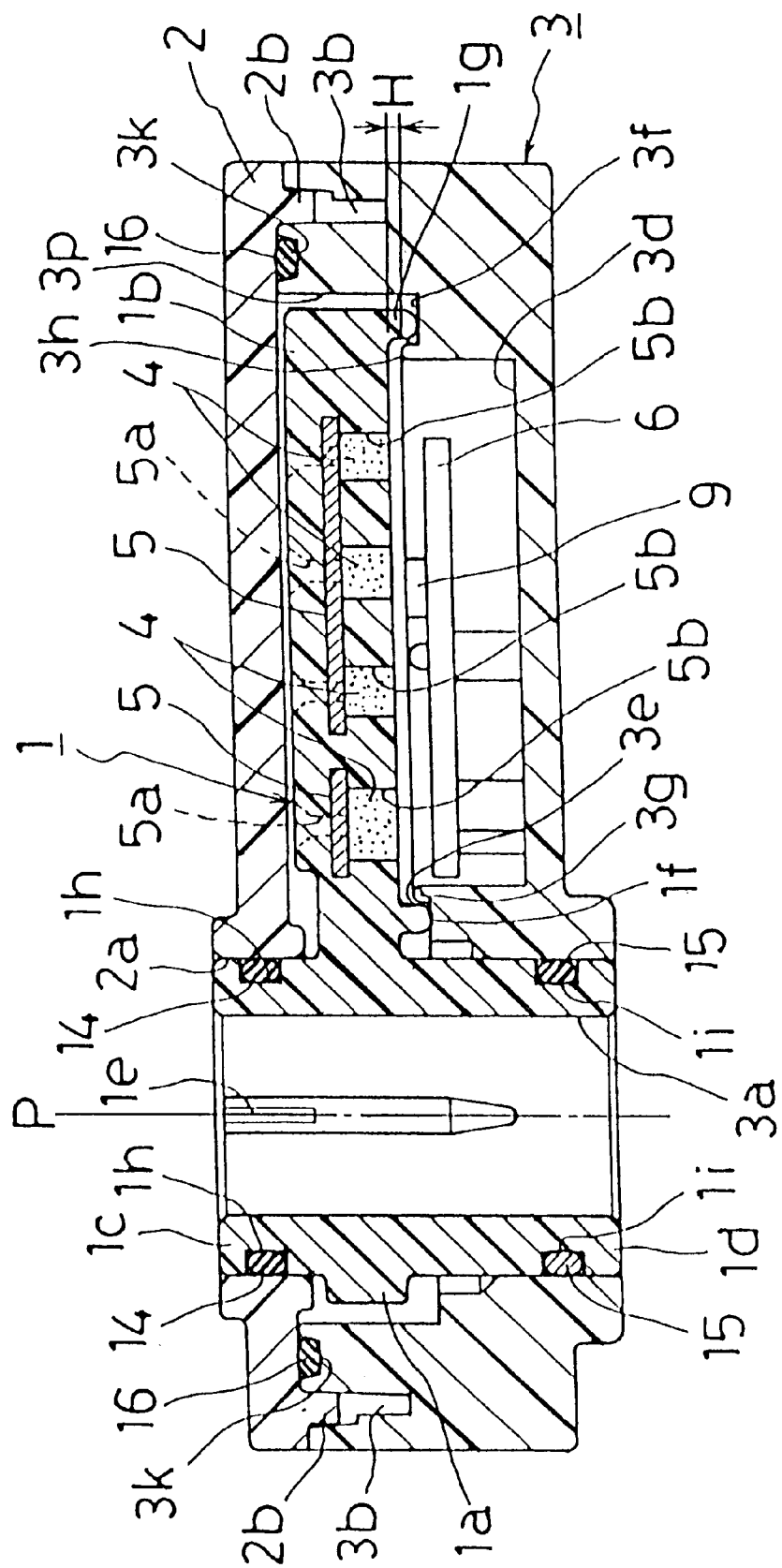
FIG. 2 is a central enlarged sectional view of the first embodiment of the present invention.

A movable base 1 is integrally formed with a cylindrical shaft section 1a of an automatic transmission device into which a transmission lever shaft (not shown) is inserted, and a movable arm 1b having permanent magnets 4 and a yoke 5. As shown in FIG. 2, the movable base 1 is rotatably supported by a cover body 2 and a pole base 3 in such a manner that the upper cylinder shaft section 1c of the cylindrical shaft section 1a is fitted with the shaft hole 2a of the case body 2. The lower cylinder shaft section 1d of the cylindrical shaft section 1a is fitted with the shaft hole 3a of the pole base 3. The cylindrical shaft section 1a may be either directly coupled with the transmission lever shaft, or indirectly coupled with the shaft (not shown) interlocking with the transmission lever shaft.

Figure 3:
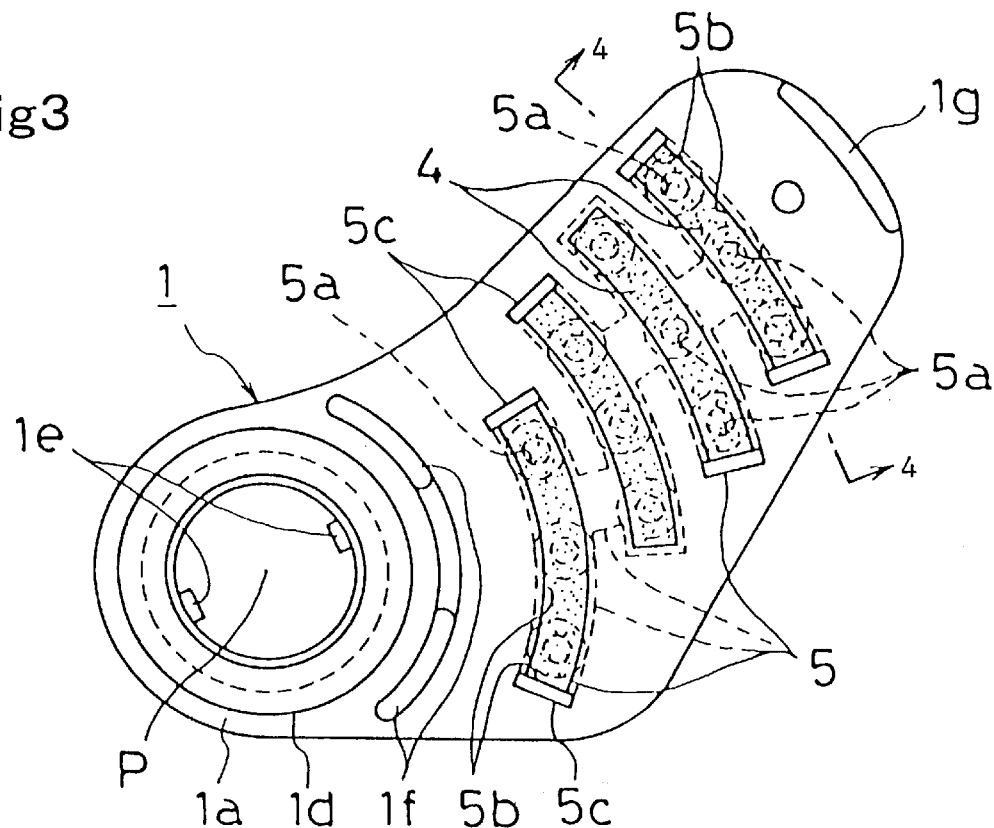
FIG. 3 is an enlarged bottom view showing the movable base of the first embodiment of the present invention.
Figure 4:
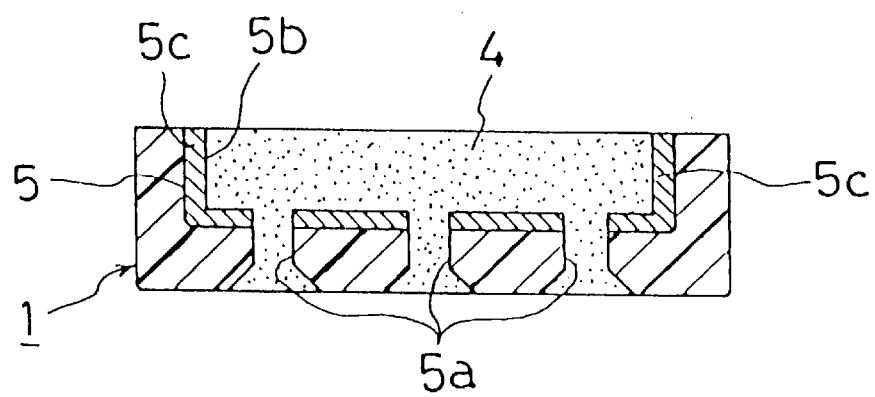
FIG. 4 is an enlarged sectional view taken along the line 4—4 in FIG. 3.
Figure 5:
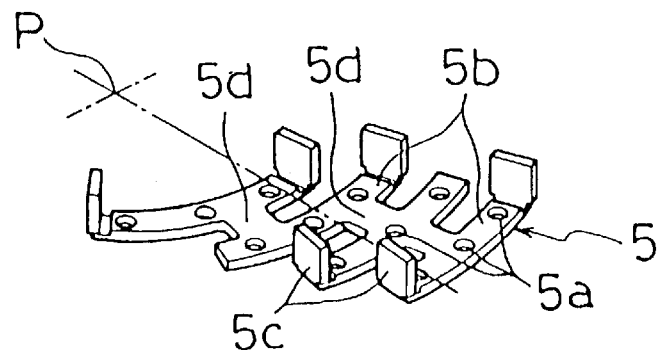
FIG. 5 is a perspective view showing the yoke of the first embodiment of the present invention.

As shown in FIGS. 3, 4 and 5, the yoke 5 is formed such that four arc-shaped iron plates are connected with each other integrally, each of the iron plates being formed as an approximate U-letter shape. The iron plates are formed with gate holes 5a at the approximate center portion of each of four bottom surfaces, respectively. Moreover, the yoke 5 integrally formed on the movable base 1 may be omitted. Moreover, the means for mounting the permanent magnet 4 on the movable base 1 is not limited, and the permanent magnet 4 is not limited with respect to kind, material and the like.

In an example for manufacturing the movable base 1, pins (not shown) are at first inserted into the gate holes 5a, respectively, and then the yokes 5 are molded with a resin by using an injection molding method. In the yokes 5 of the movable base 1, as a primary molded product made by using the injection molding method, the portion at which the bottom pieces 5b and the folded section 5c are exposed is made as a hollowed portion. Then, the movable base 1, as a primary molded product, is set on a metal mold used for forming the permanent magnet. Then, a mixture of neodymium powder (magnetic material) and PPS pellets (also referred to as bonded or plastic magnets) is injected onto the bottom piece 5b of the hollowed portion of the yoke 5, thereby forming the permanent magnet 4 as a secondary molded product. Thus, the manufacture of the movable base 1 is finished.

Moreover, as shown, for example, in FIGS. 3, 4 and 5, since each of the gate holes 5a is provided at the approximate center portion of each permanent magnet 4, each permanent magnet 4 is effectively prevented from dropping out. The number of the gate holes 5a is not specified. In the case where, for example, a single gate hole 5a is mounted on the bottom piece 5b, the gate hole 5a is set at an approximate center portion of the bottom piece 5b. Furthermore, as shown in FIG. 4, the movable base 1, the yoke 5, and the permanent magnet 4 are aligned on a single surface upon which the permanent magnets 4 of the movable base 1 are exposed.

Figure 1:
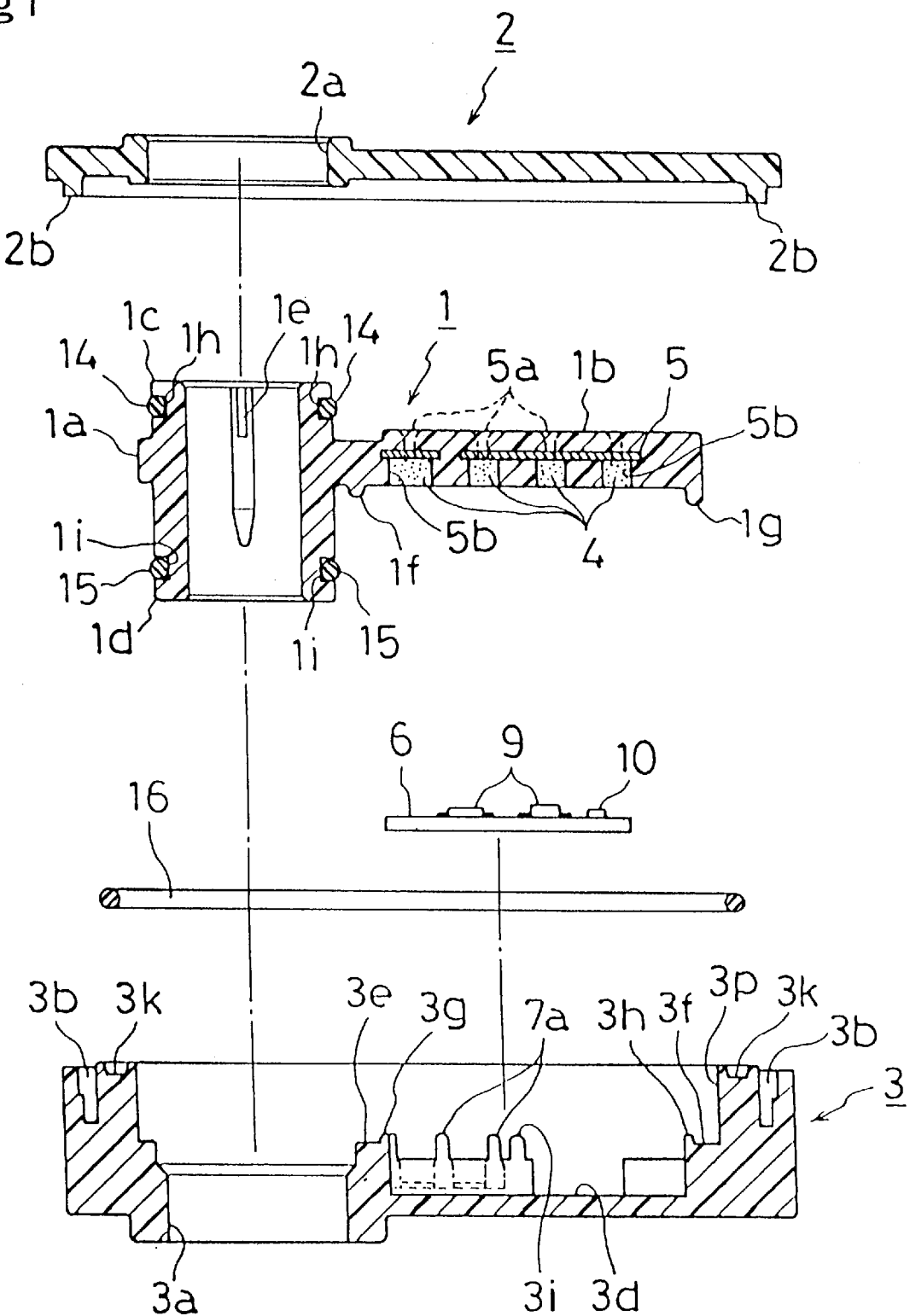
FIG. 1 is an exploded sectional view of an inhibitor switch according to a first embodiment of the present invention.

As shown in FIGS. 1 and 2, the cylindrical shaft section 1a is formed with a key 1e fitted to the key slit of the transmission lever shaft at the inner wall of the cylindrical shaft section 1a. The shaft section 1a is also formed with grooves 1h and 1i for receiving O-rings 14 and 15 at the periphery of the cylindrical shaft section 1a, respectively.

The hermetic property between the cover body 2 and the cylindrical shaft section 1a is improved by the O-ring 14 being fitted into the groove 1h. The hermetic property between the pole base 3 and the cylindrical shaft section 1a is improved by the O-ring 15 fitted into the groove 1i.

As shown in FIG. 3, at the upper surface of the movable arm 1b, four arc-shaped permanent magnets 4 and the folded section 5c of the yoke 5 are disposed at both ends of each of the permanent magnets 4. Moreover, at the lower side surface of the movable arm 1b, projected sections 1f and 1g, which are formed integrally with the movable arm 1b, are projected at the periphery of the lower side shaft section 1d and the outer periphery of the movable arm 1b, respectively. Each end of the projected sections 1f and 1g is formed with a semicircle shaped section, thereby enabling a slidable operation on the periphery of the shaft hole 3a of the pole base 3 and the sliding surfaces 3e and 3f of the outer periphery of the base surface 3d of the pole base 3, respectively.

As shown in FIGS. 1 and 2, the cover body 2 has a shaft hole 2a fitted to the upper side shaft section 1c and a ring-shaped projection 2b fitted to a coupling groove 3b formed on the peripheral lower surface of the pole base 3. The cover body 2 and the pole base 3 are made of a resin material having oil proof and heat resistance properties. An ultrasonic welding can be easily applied to such resin material. Such resin material may be nylon resins, polypropylene, and the like. The cover body 2 may be fitted to the pole base 3 through the movable base 1 and the substrate 6. Then, the coupled portion between the coupled groove 3b and the ring-shaped projection 2b is welded to achieve a hermetic seal by using an ultrasonic welding or a vibration welding.

Figure 6:
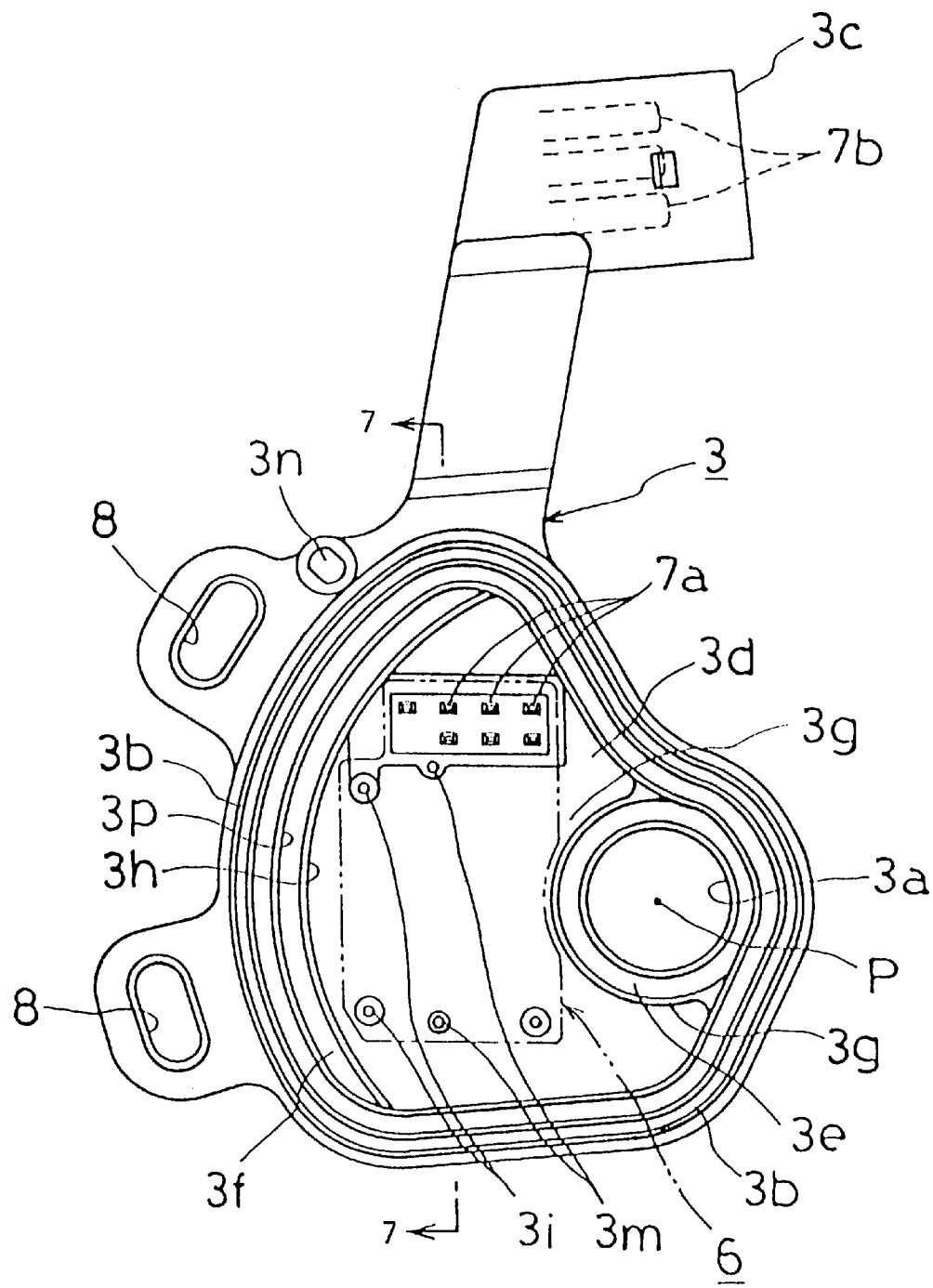
FIG. 6 is a plan view showing the pole base of the first embodiment of the present invention.

The pole base 3 is formed so that a conductive body 7 and metallic rings 8 are inserted therein. The pole base 3 may be fixed by using screws passing through the metallic rings 8, respectively, at the outer side of the automatic transmission device. As shown in FIG. 6, one of the connecting sections 7a of the conductive body 7 integrally formed with the pole base 3 is projected from the base surface 3d, and the other connecting section of the conductive body 7 is projected into a connector section 3c as terminals 7b. The pole base 3 provides a slide surface 3e on which the projected section 1f mounted at the lower surface of the movable base 1 can slide, at the outer periphery of the shaft bole 3a. Moreover, the pole base 3 provides a slide surface 3f on which the projected section 1g mounted at the lower surface of the movable base 1 can slide, at the outer periphery of the base surface 3d.

As shown in FIGS. 1, 2 and 6, the slide surfaces 3e and 3f are made smoothly in order to improve the sliding property between the movable base 1 and the projected sections 1f and 1g. The pole base 3 has an inner side peripheral edge 3h at the side of the shaft hole 3a of the sliding surface 3f, and the inner wall 3p at the outer periphery of the sliding surface 3f, so as to guide the projected section 1g. Moreover, the pole base 3 has a shaft hole 3a at the inner side of the sliding surface 3e, and an outer peripheral edge 3g at the outer side of the sliding surface 3e adjacent thereto, so as to guide the projected section 1f. The slide surfaces 3e and 3f are provided with the inner and outer periphery edges 3g and 3h each end of which is rounded so as to guide the movable base 1.

The pole base 3 is formed with a groove 3k inserted with a packing 16 for sealing the contact surface located at the periphery of the base surface 3d when the movable base 1 is received between the cover body 2 and the pole base 3. Moreover, a positioning hole 3n is provided for positioning the shaft of the transmission lever of the automatic transmission device and the movable base 1.

The yoke 5 is a molding frame for forming the desired shape of the permanent magnets 4, which are formed with magnetic material by using the injection molding method. The yoke 5 has bottom pieces 5b defining the bottom of the hollowed portion when the permanent magnet 4 is inserted into the movable base 1 as the primary molded product during the injection molding operation. Moreover, the yoke 5 has the folded sections 5c exposed to the upper surface of the movable base 1, the bottom pieces 5b forming the hollowed portion for receiving the permanent magnets 4 respectively, gate holes 5a, and interlocking sections 5d for interlocking the bottom pieces 5b.

As shown in FIGS. 3 and 5, the yoke 5 is composed of a plurality of bottom pieces 5b interlocked with each other by the interlocking sections 5d, and the folded sections 5c for forming the hollowed portion at the end portion of each of the bottom pieces 5b upon primary production. Each of the bottom pieces 5b is made as an arc-shaped piece having a radius of curvature centered about a center point P of the cylindrical shaft section 1a of the movable base 1, as shown in FIG. 3.

Figure 7:
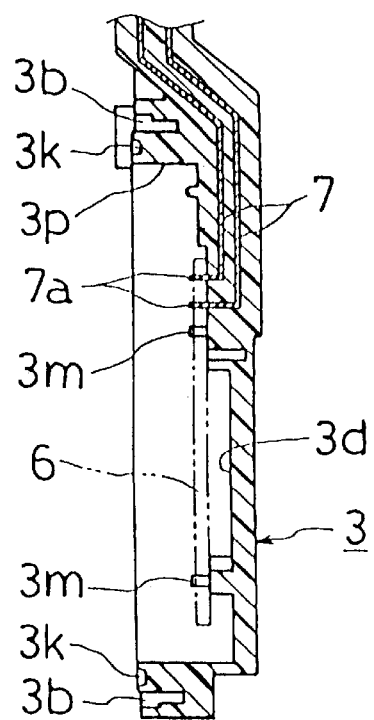
FIG. 7 is an enlarged sectional view taken along the line 7—7 in FIG. 6.
Figure 8:
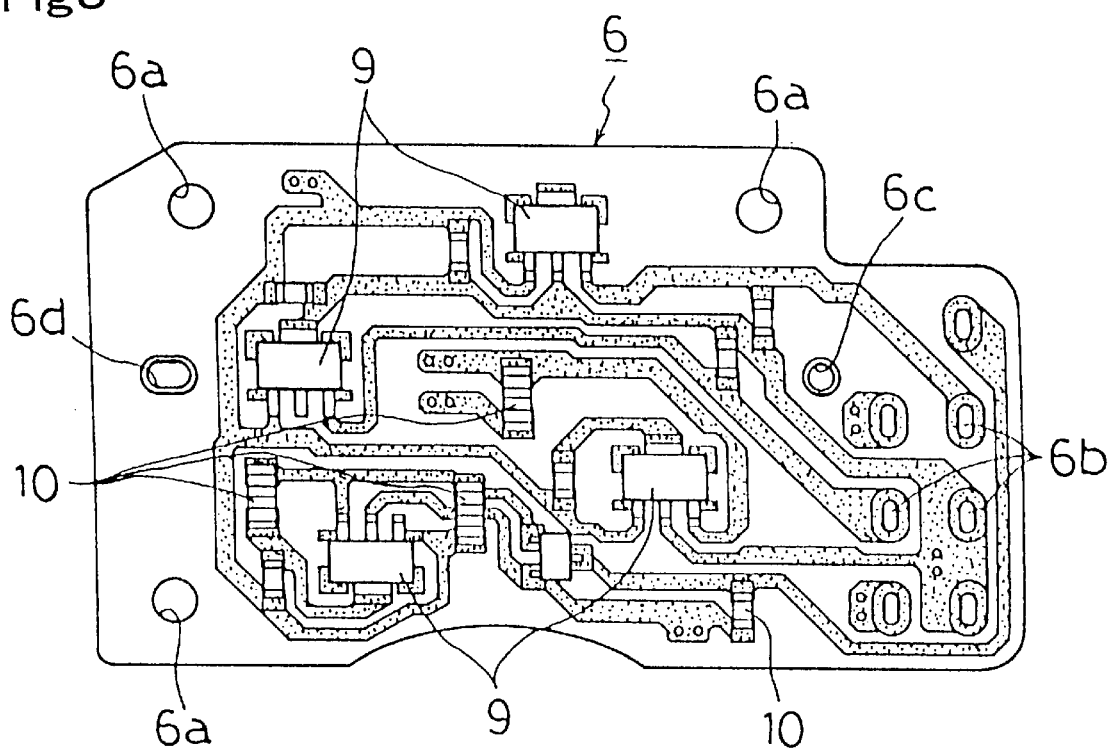
FIG. 8 is an enlarged plan view showing the substrate of the first embodiment of the present invention.

As shown in FIGS. 6 and 7, the substrate 6 is mounted in such a manner that the connecting sections 7a of the conductive body 7 projected from the base surface 3d of the pole base 3 are inserted into the through holes 6b, respectively, and welded by using solder. Moreover, as shown in FIGS. 6 and 8, two projections 3m projected from the base surface 3d of the pole base 3 are inserted into the positioning hole 6c and the position adjusting hole 6d, respectively, thereby positioning the substrate 6 at the predetermined position within the pole base 3. Screws are then used for fixing the substrate 6 by being inserted into the through holes 6a and screwed into the blind holes 3i.

As shown in FIG. 8, the positioning hole 6c is a circle mounted at the standard position for the substrate 6. The position adjusting hole 6d is an elongated hole for enabling a fine adjustment of the position for the substrate 6. The substrate 6 is mounted with a plurality of the magnetic sensors 9 for responding to the magnetic flux generated by the permanent magnets 4 disposed in opposition to the magnetic sensors 9 and electronic elements 10. The magnetic sensors 9 may be Hall-effect devices, Hall ICs, MR elements, or the like for detecting the magnetic flux. The magnetic sensors 9 are disposed so that the magnetic sensor does not contact with the movable base 1, as shown in FIG. 2. The gap H between the magnetic sensor 9 and the permanent magnet 4 is preferably about 0.1 mm to 0.6 mm.

The operation of the first embodiment of the present invention constructed as described above will now be described in detail hereinafter.

When a driver operates the shift lever, the transmission operating position of the automatic transmission device for automobiles is changed. At that time, the movable base 1 received within the inhibitor switch is rotated around the cylindrical shaft section 1a in accordance with the movement of the shift lever, and the permanent magnets 4 are also moved in accordance with movement of the shift lever. The magnetic sensor 9 of the substrate 6 mounted at the position adjacent to the movable base 1 detects the transmission operating position in response to the change of the magnetic flux due to the movement of the permanent magnet 4.

Figure 10:
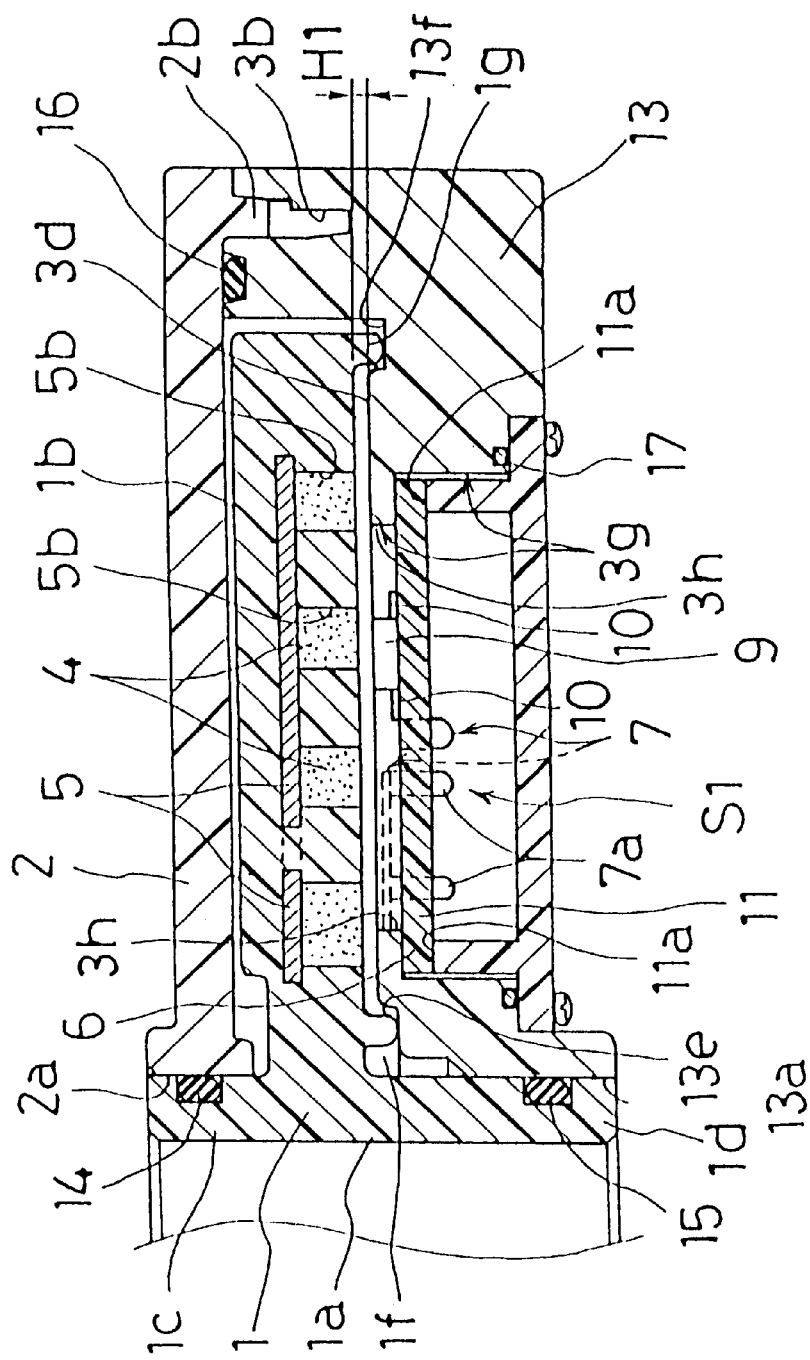
FIG. 10 is an enlarged sectional view of the main portion of the second embodiment of the present invention.
Figure 11:
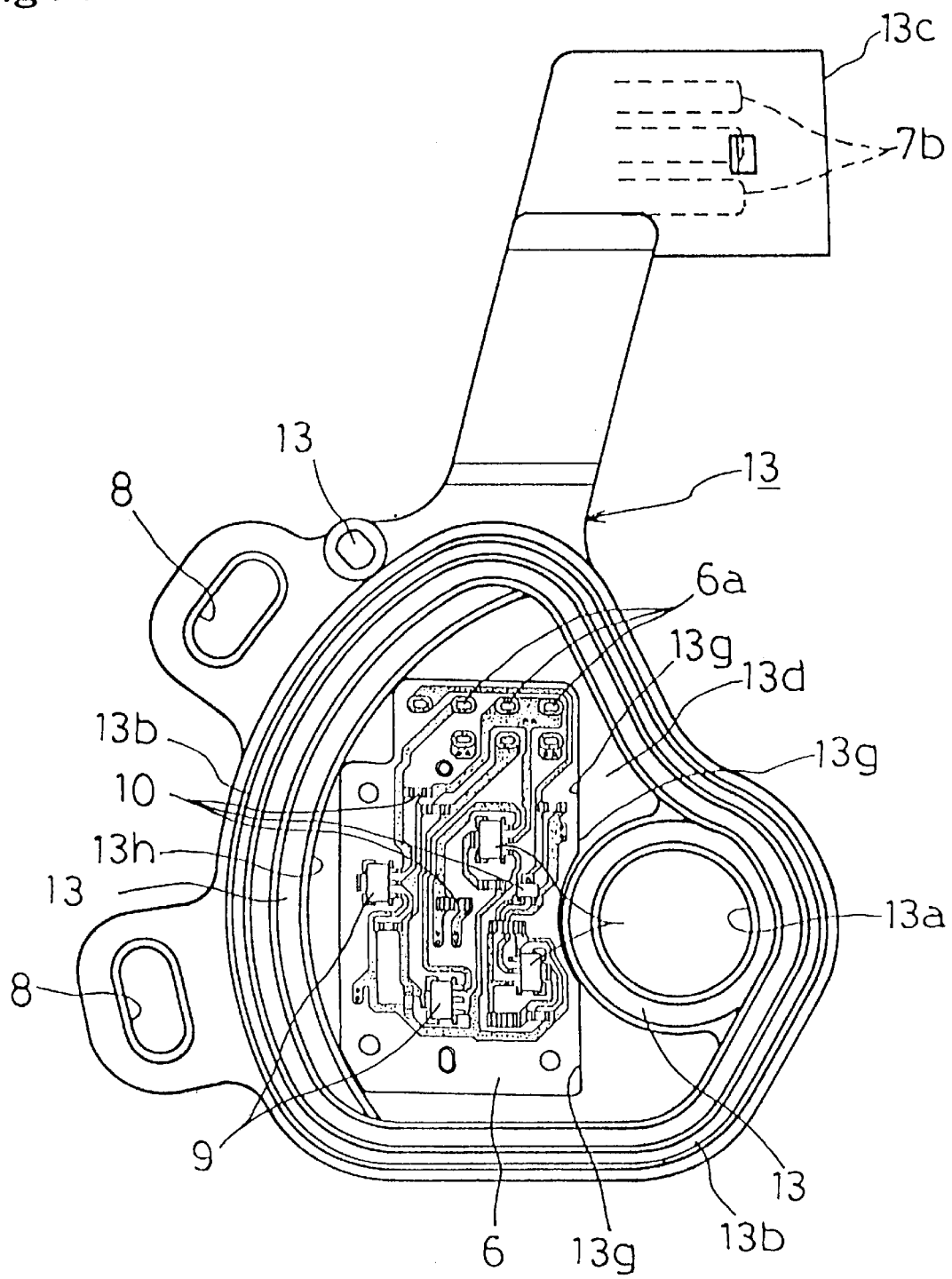
FIG. 11 is an enlarged plan view showing the pole base of the second embodiment of the present invention.

The second embodiment of the present invention will now be described in detail with reference to FIGS. 9 to 11 of the accompanying drawings. The same reference numerals are used to designate elements in the second embodiment that are the same as those contained in the first embodiment, and further explanation of such elements is thus omitted.

The second embodiment provides an inhibitor switch having a cover body 2, a movable base 1, and a substrate 6, all of which were described in detail in the first embodiment. A pole base 13 is provided in the second embodiment, which is different from the pole base 3 described in the first embodiment.

The pole base 13 is provided with a through hole 13g on the base surface 13d, connecting sections 7a at one end of the conductive body 7 to be connected to the substrate 6, and terminals 7b at the other end of the conductive body 7. The connecting sections 7a are projected from the edge portion of the through hole 13g, and the terminals 7b are projected in a connector section 3c.

The through hole 13g is formed with a projection 13h for supporting the substrate 6 installing the magnetic sensors 9 at the upper peripheral edge section thereof. Moreover, the through hole 13g is formed with a groove 13i for receiving a packing 17, and an offset surface 13j for receiving the substrate 6. The through hole 13g is formed with a receiving space Si for receiving the substrate 6. The receiving space Si is closed by a lower cover 11 made of resin after the substrate 6 has been inserted thereinto from the aperture at the lower side of the through hole 13g. Furthermore, the through hole 13g may be formed in accordance with the shape of the base surface 13d and the substrate 6, as shown in FIG. 11.

The projection 13h may be plural tongue pieces projected from the aperture at the upper end side of the through hole 13g, or projected pieces formed at the inner periphery of the through hole 13g. As shown in FIGS. 9 and 10, the pole base 13 is provided with a packing 16 on the contact surface between the periphery of the base surface 13d receiving the movable base 1 and the cover body 2. Moreover, numeral 13n, as shown in FIG. 11, denotes a positioning hole for positioning the location between the transmission lever shaft of the automatic transmission device and the movable base 1.

The substrate 6 is fixedly mounted in such a manner that the connecting sections 7a of the conductive body 7 are inserted into through holes 6a and welded by using solder, respectively. The substrate 6 is sandwiched between the projecting section 13h of the pole base 13 and the pressing sections 11a of the lower cover 11 fitted on the through hole 13g.

Figure 9:
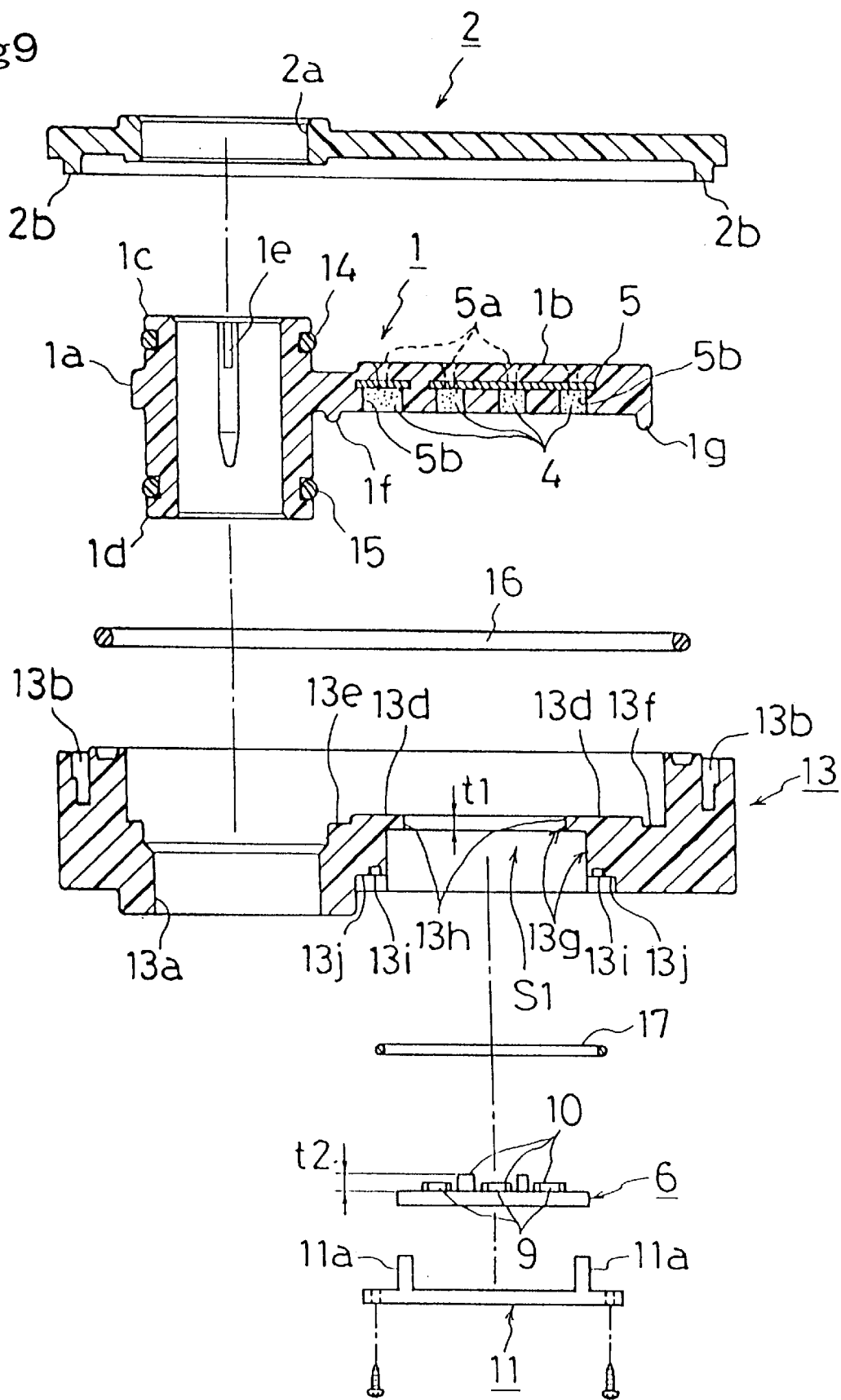
FIG. 9 is an exploded sectional view of an inhibitor switch according to a second embodiment of the present invention.

The thickness t1 of the projecting section 13h, as shown in FIG. 9, is made larger than the maximum height t2 of the electronic elements 10, such as the magnetic sensors 9 installed on the substrate 6. By this construction, the electronic elements 10, such as the magnetic sensors 9, are sufficiently received within the projecting section 13h to avoid any external force being applied to the electronic elements 10.

The lower cover 11 is fixed by using screws or the like in the aperture at the lower end section of the through hole 13g through the packing 17. By this construction, the sealed condition of the space formed with the pole base 13 and the cover body 2 is improved, and the electronic elements 10, such as the magnetic sensors 9 or the like, are guarded. The pressing sections 11a can be either plural projected pieces or cylindrical bodies, and therefore its formation should not be limited.

The second embodiment of the present invention as described above effects the same operation as that of the first embodiment described above.

Figure 12:
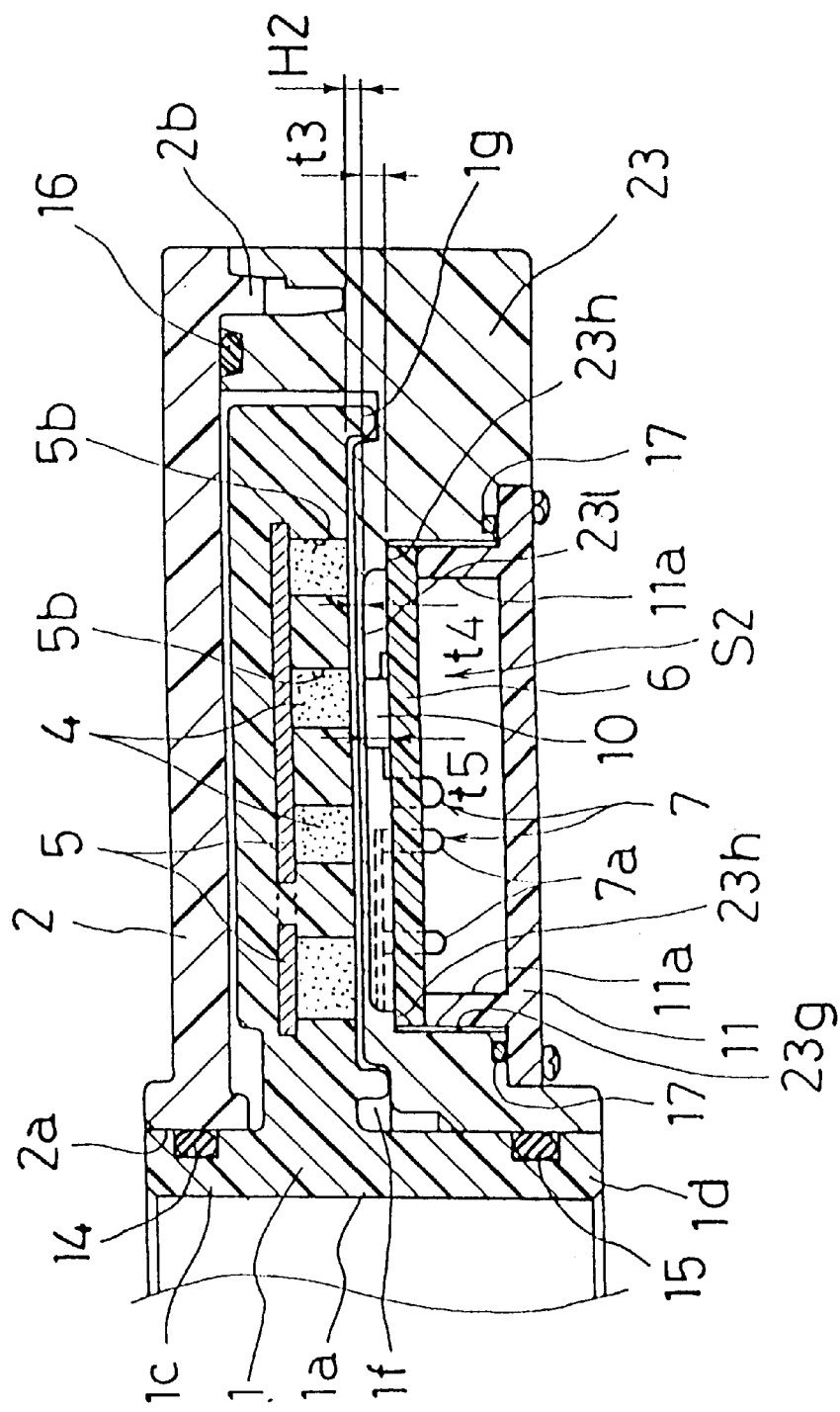
FIG. 12 is an enlarged sectional view of the main portion of the third embodiment of the present invention.

The third embodiment of the present invention will now be described in detail hereinafter with reference to FIG. 12 of the accompanying drawings. The same reference numerals are used to designate like elements in the third embodiment as those contained in the first and second embodiments, and further explanation of such elements is thus omitted.

According to the third embodiment of the present invention, an inhibitor switch is provided comprising a cover body 2, a movable base 1, a substrate 6, and a lower cover 11, all of which were described in detail in the first and second embodiments. A pole base 23 is provided in the third embodiment, which is different from the pole bases 3 and 13 described above in the first and second embodiments, respectively.

The pole base 23 is integrally formed with a thin partition wall 23l for closing the ceiling of the blind hole 23g corresponding to the through hole 13g of the first embodiment. The thickness t4 of the partition wall 23l is not limited, but it is desirable to set such thickness to the extent that the thickness does not affect impart any unsuitable influence in detecting the magnetic flux due to the permanent magnet 4 by the magnetic sensors 9. The projecting section 23h for depressing the substrate 6, which has a thickness larger than that of the partition wall 23l, is formed at the periphery of the partition wall 23l, i.e., at the upper peripheral edge of the blind hole 23g.

The substrate 6 installed with the magnetic sensors 9 and the lower cover 11 sandwiching the substrate 6 in cooperation with the projecting section 23h of the pole base 23 are fixed by using screws on the lower surface of the partition wall 23l through the packing 17. By this construction, the sealing condition of the receiving space S2 composed of the blind hole 23g of the pole base 23 and the lower cover 11 is improved, and the electronic elements 10, such as the magnetic sensors 9, are guarded.

The thickness t3 of the projecting section 23h is set to be approximately equal to or slightly larger than the height t5, which is the maximum height among the electronic elements 10, such as the magnetic sensors 9 installed on the substrate 6. By this construction, the electronic elements 10, such as the magnetic sensors 9, are sufficiently received within the projecting section 23h, thereby avoiding any external force being applied to the electronic elements 10. Moreover, the gap H2 between the magnetic sensors 9 and the permanent magnets 4 is made constant.

The projecting section 23h is projected at the upper peripheral edge of the blind hole 23g toward the inner side thereof. The projecting section 23h may be a ring-shaped projecting piece formed at the entire portion of the upper inner peripheral edge of the blind hole 23g or plural projected pieces, and its shape should not be limited. Moreover, the shape of the blind hole 23g has only to be set in accordance with the shape of the substrate 6 and the like, and therefore its shape should not be limited.

The present invention thus constructed has the following advantages and effects.

The inhibitor switch comprises a pole base provided with a movable base having permanent magnets and adapted to be rotated in accordance with the transmission operating position of an automatic transmission device, and magnetic sensors for detecting the magnetic flux from the permanent magnets, and a cover body for rotatably supporting the movable base. The inhibitor switch is characterized in that the pole base has an approximate arc shape with a radius of curvature centered about the center of a shaft hole. The pole base also has a base surface for forming the space for receiving a substrate on which the magnetic sensors and electric elements are installed, and projected connecting sections of a conductive body used for electric connection on the substrate. The shaft hole is coupled with a cylindrical shaft section of the movable base at the end of the base surface. Therefore, it becomes possible to eliminate the conventional problems which have been caused in the case where the substrate, on which magnetic sensors, terminals and the like are installed by using solder, is integrally inserted into a main body through an injection molding method. It also becomes possible to present an inhibitor switch with a low manufacturing cost, high handling property during operation, connecting sections of the conductive body being installed on the substrate, and efficiency in manufacturing.

The pole base is formed with a sliding surface formed at the periphery of the shaft hole for slidably contacting with a projected section formed at the lower surface of the movable base, and a sliding surface formed at the outer periphery of the base surface of the pole base for slidably contacting with a projected section formed at the lower surface of the movable base. Therefore it becomes possible to achieve a precise positioning of the movable base in the direction of the rotation axis, and a precise relationship in position between the permanent magnets and the magnetic sensors, thereby improving the precision of the inhibitor switch. It also becomes possible to further reduce the friction and improve the smoothness of the movable base, respectively.

The pole base is formed with an inner side peripheral edge of the sliding surface, and an inner wall at the outer peripheral edge of the sliding surface. Therefore, it becomes possible to guide the rotating end portion of the movable base, thereby stabilizing the motion of the movable base.

The shaft hole of the pole base is positioned at the inner side of the sliding surface, and the pole base is formed with an outer peripheral edge of the sliding surface. Therefore, it becomes possible to eliminate the deviation in rotation of the movable base, thereby improving smoothness thereof and preventing powder due to abrasion from penetrating into the locations of the magnetic sensors and the electronic elements on the substrate.

The pole base is provided with projections projected from the base surface, which are fitted with a positioning hole and a position adjusting hole mounted on the substrate, respectively. Therefore, it becomes possible to set the substrate and the magnetic sensors at a precise position, thereby improving the precision of the inhibitor switch.

The pole base is provided with a through hole formed with a projecting section projected from the aperture at the upper end side toward the inner side thereof on the base surface. Further, the magnetic sensors installed on the substrate are inserted into the through hole as a receiving space therefor. Therefore, it becomes possible to easily mount the substrate on the pole base, and to provide a precise relationship in position between the permanent magnets and the magnetic sensors because the upper surface of the substrate is positioned by the projected section. The precise relationship in position is possible even if a printed substrate with low precision in dimension is utilized, thereby improving the precision of the inhibitor switch.

The substrate is sandwiched between the projecting section and a lower cover for closing the aperture at the lower end side of the through hole. Therefore, it becomes possible to easily mount the substrate on the pole base without using any fastening members such as adhesive, screws and the like, and further to reduce the number of parts and man-hours for assembly, thereby reducing the manufacturing cost.

The inhibitor switch according to another aspect of the invention comprises a pole base provided with a movable base having permanent magnets and adapted to be rotated in accordance with the transmission operating position of an automatic transmission device, and magnetic sensors for detecting the magnetic flux from the permanent magnets, and a cover body for rotatably supporting the movable base. The inhibitor switch is characterized in that the pole base is formed with a receiving space composing a blind hole for receiving a substrate installed with magnetic sensors at its lower surface. Therefore, it becomes possible to avoid any external force to be applied to the magnetic sensors.

The pole base is formed with a partition wall at the ceiling of the blind hole. Therefore, it becomes possible to avoid the contact of the rotating movable base with the magnetic sensors and the electronic elements, and to seal the space made of the cover body and the pole base. It also becomes possible to maintain a constant gap between the magnetic sensors and the permanent magnets, thereby improving the precision of the inhibitor switch. Moreover, it becomes possible to maintain the distance between the magnetic sensors and the permanent magnets even if the substrate has a margin of error in thickness.

The pole base is formed with a projecting section at the lower peripheral portion of the partition wall, and the substrate is sandwiched between the projecting section and a lower cover for closing the aperture at the lower end side of the blind hole. Therefore, it becomes possible to hermetically dispose the magnetic sensors and the substrate within the blind hole, thereby preventing water drops, powder due to abrasion, dust and the like from penetrating and attaching onto the magnetic sensors. This construction completely avoids the contact of the movable base with the magnetic sensors.

The lower cover is formed with a pressing section projected from the lower cover for pressing the lower peripheral edge of the substrate. Therefore, it becomes possible to provide the magnetic sensors mounted on the substrate with a predetermined gap, and to avoid the deterioration in the precision of the inhibitor switch due to the margin of error in the thickness of the substrate. Moreover, since the substrate is installed from the lower side of the pole base, it becomes possible to assemble the substrate after the cover body has been welded with the pole base by an ultrasonic welding method or a vibration welding method. This construction avoids bad influence due to ultrasonic waves and increases the precision thereof. Moreover, it becomes possible to easily adjust the position of the substrate upon disposing it.

The electronic elements, such as the magnetic sensors installed on the substrate, are disposed within the projecting section. Therefore, it becomes possible to avoid any external force being applied to the electronic elements upon assembling of the substrate, and further to effectively utilize the space, thereby achieving an inhibitor switch with a thin dimension.

It will be appreciated that the present invention is not limited to the exact construction that has been described above and illustrated in the accompanying drawings, and that various modifications and changes can be made without departing from the scope and spirit thereof. It is intended that the scope of the invention only be limited by the appended claims.

What is claimed is:

1. An inhibitor switch, comprising:
    a pole base;
    a movable base rotatably supported by said pole base, said movable base having permanent magnets and being rotatable in accordance with a transmission operating position of an automatic transmission device;
    magnetic sensors for detecting magnetic flux from said permanent magnets, said magnetic sensors being assembled on a substrate; and
    a cover body coupled to said pole base and rotatably supporting said movable base;
    said pole base has an arc shape with a radius of curvature centered around a center of a shaft hole, said pole base has a base surface forming a space for receiving said substrate, said pole base has a conductive body inserted in said pole base with connecting sections projecting therefrom for electric connection with said sensors on said substrate, and said shaft hole is coupled with a cylindrical shaft section of said movable base at an end of said base surface; and
    said movable base has first and second projections formed at spaced locations on a side facing the pole base, and said pole base is formed with a first sliding surface at an outer periphery of said shaft hole and a second sliding surface at an outer periphery of said base surface, said first and second projections slidably contacting said first and second sliding surfaces, respectively, to slidably support said movable base so as to maintain an accurate distance between said permanent magnets and said magnetic sensors.

2. The inhibitor switch according to claim 1, wherein said pole base is formed with a raised inner peripheral edge at an inner periphery of said second sliding surface and a wall at an outer periphery of said second sliding surface.

3. The inhibitor switch according to claim 1, wherein said shaft hole of said pole base is positioned at an inner side of said first sliding surface, and said pole base is formed with a raised peripheral edge at an outer periphery of said first sliding surface.

4. The inhibitor switch according to claim 1, wherein said pole base is provided with first and second projections projecting from said base surface which are fitted into a positioning hole and a position adjusting hole on said substrate, respectively.

5. The inhibitor switch according to claim 1, wherein said pole base is provided with a through hole formed with a projecting section projected from an upper end side of said through hole toward an inner side thereof, and said magnetic sensors on said substrate are inserted into said through hole as a receiving space therefor.

6. The inhibitor switch according to claim 5, wherein said substrate is sandwiched between said projecting section and a lower cover for closing the aperture at a lower end side of said through hole.

7. The inhibitor switch according to claim 6, wherein said lower cover has a pressing section that presses a lower peripheral edge of said substrate, said pressing section projecting from said lower cover.

8. The inhibitor switch according to claim 5, wherein electronic elements are installed on said substrate and are disposed within said projecting section.

9. An inhibitor switch, comprising:

a pole base;

a movable base rotatably connected to said pole base, said movable base having permanent magnets and being rotatable in accordance with a transmission operating position of an automatic transmission device;

magnetic sensors for detecting magnetic flux from said permanent magnets, said magnetic sensors being assembled on a substrate; and a cover body coupled to said pole base and rotatably supporting said movable base;

said pole base being formed with a receiving space for receiving said substrate with said magnetic sensors assembled thereon, said receiving space being closed on a side facing said movable based by an integral partition wall of said pole base disposed between said receiving space and said permanent magnets.

10. The inhibitor switch according to claim 9, wherein said pole base is formed with a projecting section at a lower peripheral portion of said partition wall, and said substrate is sandwiched between said projecting section and a lower cover for closing an aperture at a lower end side of said receiving space.

11. The inhibitor switch according to claim 10, wherein said lower cover is formed with a pressing section for pressing a lower peripheral edge of said substrate, said pressing section projecting from said lower cover.

\* \* \* \* \*